United States Patent [19]

Marshall

[11] Patent Number: 4,523,324
[45] Date of Patent: Jun. 11, 1985

[54] DIRECT MODULATION FM DATA RECEIVER

[75] Inventor: Christopher B. Marshall, Horley, England

[73] Assignee: U.S. Philips Corporation, New York, N.Y.

[21] Appl. No.: 435,426

[22] Filed: Oct. 20, 1982

[30] Foreign Application Priority Data

Oct. 26, 1981 [NL] Netherlands .................... 8132181

[51] Int. Cl.³ .............................................. H03D 3/13
[52] U.S. Cl. ...................................... 375/91; 329/122; 375/97; 455/208; 455/324
[58] Field of Search ............ 375/80, 88, 91, 97; 455/205, 208, 324; 307/520, 524; 329/107, 110, 122, 150, 153, 154

[56] References Cited

U.S. PATENT DOCUMENTS

| | | | |
|---|---|---|---|
| 2,715,677 | 8/1955 | Turner | 375/91 |
| 2,881,319 | 4/1959 | Sills | 329/122 |
| 2,993,958 | 7/1961 | Barnes | 455/324 |
| 3,286,256 | 11/1966 | Covill | 455/324 |
| 4,339,823 | 7/1982 | Predina et al. | 329/122 |
| 4,355,407 | 10/1982 | Mueller | 375/91 |

Primary Examiner—Benedict V. Safourek
Attorney, Agent, or Firm—Joseph F. Abate

[57] ABSTRACT

A direct modulation FM data receiver including a mixer (14) having a first input for receiving a directly modulated FM signal ($f_c \pm \Delta f$), where $\Delta f$ is the deviation and $f_c$ the carrier, and a second input for a local oscillator (20) signal ($f_L$) having a frequency within the signal channel but offset from the input signal carrier ($f_c$) by an amount ($\delta f$). Demodulating circuits (22 to 30) distinguish between the signalling tones ($\Delta f + \delta f$) and ($\Delta f - \delta f$) and derive a data output signal therefrom.

3 Claims, 8 Drawing Figures

DIRECT MODULATION FM DATA RECEIVER

BACKGROUND OF THE INVENTION

The present invention relates to a direct modulation FM data receiver which is suitable for fabricating as an integrated circuit (IC) and can be used as a paging receiver.

There have been many proposals, see for example British Patent Specification No. 1,530,602, for what is termed "direct conversion" or "zero i.f." receiver structures which were intended to be fabricated as an IC and may constitute an alternative to the conventional superheterodyne receiver. Because the frequency of the output of a direct conversion receiver is the same for positive and negative displacements of the modulating signal from the carrier frequency, it is necessary to provide a pair of front end mixers which provide quadrature outputs and considerable demodulator complexity in order to distinguish between the positive and negative cases.

SUMMARY OF THE INVENTION

Accordingly it is an object of the present invention to simplify the construction of a direct modulation FM data receiver.

According to the present invention there is provided a direct modulation FM data receiver comprising a mixer having a first input for receiving a directly modulated FM signal with a deviation ($\Delta f$) and a second input for a local oscillator signal having a frequency within the signal channel but offset from the carrier frequency by an amount ($\delta f$), and demodulating means for distinguishing between the signalling tones ($\Delta f + \delta f$) and ($\Delta f - \delta f$) and deriving an output data signal therefrom.

The present invention is based on the recognition of the fact that by offsetting the local oscillator frequency from the carrier frequency, $f_c$, by a small amount, $\delta f$, then the two signalling tones $\Delta f \pm \delta f$ which are derived from the mixer are no longer equal and a much simpler demodulator circuit can be used. The simpler the circuit then the more cheaply and the more readily that the receiver can be integrated. In particular the problems of quadrature mixers and channel balancing are avoided. The resulting receiver is suitable for the reception of low bit-rate, high deviation FM signals such as are used in paging.

Furthermore, as the adjacent channels are both higher in frequency at the mixer output than the wanted signalling tones, then the adjacent channels can be removed by a low pass filter. This is unlike a superheterodyne receiver where the adjacent channels lie on either side of the wanted signal which can only be selected using a bandpass filter.

In an embodiment of the present invention means are provided for improving channel selectivity. These means may include bandpass filters in the demodulating means, each filter being optimised to pass its associated signalling tone. Adaptive filters may alternatively be used for this purpose. In order that the filters can separate the two signalling tones, the offset ($\delta f$) should exceed approximately half the data bit rate. Additionally or alternatively a low pass filter or another bandpass filter may be provided which is coupled in the signal path from the mixer to the demodulating means. An advantage of using another bandpass filter which has a passband sufficiently wide to pass the signalling tones over a low pass filter is that some of the low frequency 1/f noise can be attenuated.

The local oscillator may comprise a high stability oscillator. Alternatively the local oscillator can be stabilized with an AFC system which may derive a control voltage from the data output of the demodulating means or from the output of the mixer or the bandpass filters in the demodulating means. In the latter case a signal from the mixer or bandpass filters after summation is mixed again with another local oscillator signal having a frequency corresponding to the deviation $\Delta f$. After filtering the output from the another mixer, the signal therefrom undergoes frequency discrimination. The discriminator output comprises a control voltage which is applied to the local oscillator.

If desired automatic gain control may be applied in the receiver.

In order to maximize on the width of the guard band between the adjacent channels, it is desirable that the offset ($\delta f$) of the local oscillator is less than the deviation.

DESCRIPTION OF THE DRAWINGS

The present invention will now be described, by way of example, with reference to the accompanying drawings, wherein.

DESCRIPTION OF THE PREFERRED EMBODIMENTS

Figure 2:
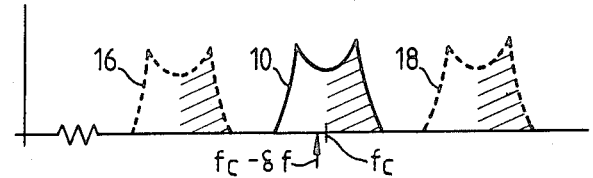
FIG. 2 illustrates the frequency spectrum of an input signal.
Figure 3:
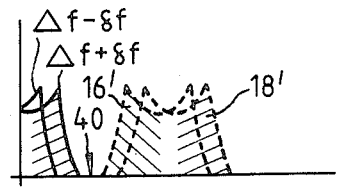
FIG. 3 illustrates the frequency spectrum of the signals at the output of the mixer shown in FIG. 1.

Referring to the drawings, a direct modulation FM input signal 10 (FIG. 2) with carrier $f_c$ and deviation $\Delta f$, that is at a frequency $f_c \pm \Delta f$, is received by an antenna or input signal receiving element 12 and applied to one input of a mixer 14. Besides the desired signal, also adjacent channel signals 16, 18, shown in broken lines (FIG. 2), will be received and passed to the mixer 14. A high stability local oscillator 20 having in the present embodiment a frequency $f_L = f_c - \delta f$ which is within the signal channel but which is offset by a small amount ($\delta f$) from the carrier frequency ($f_c$), is connected to the mixer 14. Although not described in detail hereinafter the local oscillator could have a frequency ($f_c + \delta f$). The output of the mixer 14 includes the signalling tones $\Delta f + \delta f$ and $\Delta f - \delta f$, and the frequency shifted adjacent channel signals 16', 18' as shown in FIG. 3. From an examination of the output spectrum of the mixer, FIG. 3, it will be observed that the two peaks at the signalling tones $\Delta f + \delta f$ and $\Delta f - \delta f$ are separated by $2\delta f$. As the signalling tones differ in frequency, they can now be distinguished from each other by a suitable discriminator.

In the illustrated embodiment this is done by separating the tones from each other and from any low frequency noise by bandpass filters 22, 24, respectively, having a bandwidth of the order of the bit rate, say 500 Hz for a bit rate of 512 bits/second. The output of each bandpass filter 22, 24 is applied to a respective amplitude (or envelope) detector 26, 28. In order to recover the data signal the outputs of the amplitude detectors 26, 28 are compared in a difference circuit 30 to provide a data output on a terminal 32.

If desired, adaptive filters (not shown) may be used in place of the bandpass filters 22, 24. Adaptive filters are known and are disclosed for example on pages 191 to 194 of "Applications of Linear Integrated Circuits" by E. R. Hnatek, published by J. Wiley & Sons, 1975. It is felt sufficient to say that they work by monitoring for example the phase relationship between the input and the output of a filter to derive an error signal. When the filter is correctly tuned the phase relationship between the input and output is correct. Thus in the demodulator described the adaptive filters would then adjust themselves following variations in the tone frequency. Consequently a small amount of local oscillator drift could be allowed for in this way, because the adaptive filter could act as a final trim to remove any drift remaining after for example automatic frequency control (AFC) has been applied. A benefit of using an adaptive filter is that it would be able to follow variations in deviation, $\Delta f$, which may not be a tightly controlled parameter.

Preferably the offset $\delta f$ is less than the deviation $\Delta f$ in order to avoid too big a separation between the peaks and undue erosion of the guard band between the adjacent channels. The upper limit of the offset is when the guard band is eroded to zero.

If it is found that the bandpass filters 22, 24 do not provide sufficient adjacent channel selectivity then the frequency shifted adjacent channel signals 16', 18' can be attenuated by connecting a low pass or a bandpass filter 36 between the output of the mixer 14 and the bandpass filters 22, 24. The bandwidth (e.g. 9 kHz to 15 kHz) of the filter 36 is such that the filter 36 will pass frequencies $\Delta f - \delta f$ and $\Delta f + \delta f$, but reject the adjacent channels 16', 18'. In fact the filter 36 may be essential in situations where the discriminator does not provide filtering or where there is narrow channel spacing because by using the offset local oscillator signal $f_c - \delta f$ (or $f_c + \delta f$), the guard band 40 (FIG. 3) between the signals is narrower than between adjacent channels of the received signal at the antenna 12. As both the adjacent signal channels 16' and 18' are both higher in frequency at the mixer output than the wanted signalling tones, then the channels 16' and 18' can be removed by a low pass filter (unlike a superheterodyne receiving system where the adjacent channels lie on either side of the wanted signal which can only be selected using a bandpass filter). An advantage of implementing the filter 36 as a bandpass filter rather than as a low pass filter is that its characteristics rolls-off more sharply and therefore is more selective and can omit some of the 1/f noise.

High stability of the local oscillator 20 is necessary in order to help produce the signalling tones of the desired frequencies. If for example the local oscillator frequency $f_L$ ($=f_c - \delta f$) drifts while the carrier $f_c$ of the received signal is constant then the signalling tones $\Delta f - \delta f$ and $\Delta f + \delta f$ will move symmetrically about the direct conversion point and then track (see FIGS. 6A and 6B). If the local oscillator and carrier drift towards each other then the two tones move towards each other, that is $|\delta f|$ decreases, while if they drift apart then the tones separate.

The local oscillator 20 can in itself be a high stability oscillator but this is expensive. The alternative is to provide AFC (automatic frequency control) which is more difficult to implement than in conventional receiver architecture.

Figure 4:
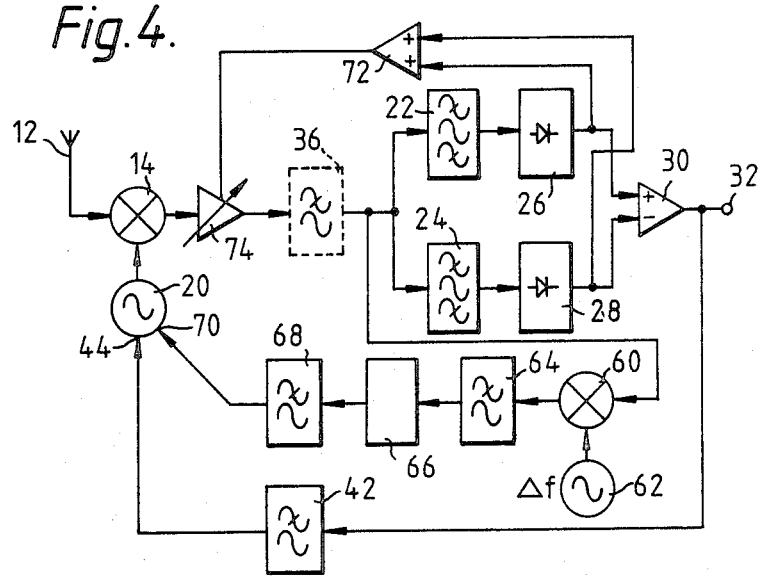
FIG. 4 is a block schematic circuit diagram of a direct modulation FM data receiver including automatic frequency control and automatic gain control, FIG. 5 are pole-zero diagrams of the second order bandpass filters used in FIGS. 1 and 4, the abscissa represents damping (d) and the ordinate represents frequency (f)

FIG. 4 shows two alternative AFC methods which can be used with the direct modulation FM data receiver made in accordance with the present invention. In FIG. 4 the same reference numerals have been used as in FIG. 1 to indicate corresponding features.

Figure 5:
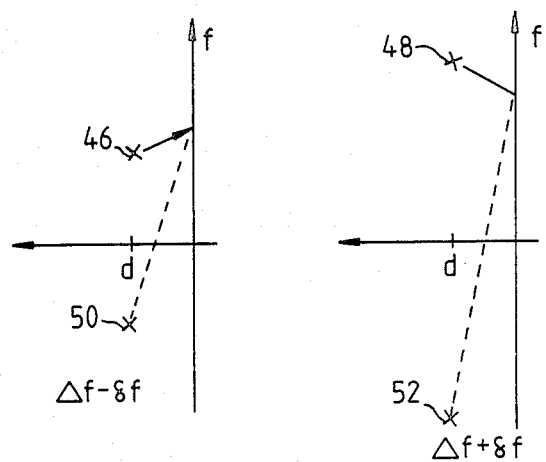

A first and less preferred AFC method is to connect a low pass filter 42 with a passband of, say, 0 to 5 Hz between the data output terminal 32 and a frequency control input 44 of the local oscillator 20. The theory behind this AFC method makes the damping factor (d) of each filter 22, 24 identical as in FIG. 5, so that their bandwidths are similar. With the gains of the two sections set so as to be equal at the center frequency, then the responses of the filters 22, 24 to signals $e^{j\omega t}$ either side of their center frequency may be factorized into two terms—the effect of the "near" and "distant" (or conjugate) poles 46, 48 and 50, 52, respectively, FIG. 5. The effect of the "near" pole 46, 48 is the same for both filters 22, 24, so that the difference between the gains of the two filters, when off-tune is determined by the "distant" poles (scaled by the "near" pole response). When off-tune then one tone is at a lower frequency than normal and the other at a higher frequency than normal, their "distant" responses increase and decrease accordingly as indicated by the reciprocal of the length of the broken lines in FIG. 5.

If it is assumed that in the data signal an equal proportion of "1"s and "0"s are transmitted, then the average level of the data output on terminal 32 yields an AFC voltage from the low pass filter 42. The maximum theoretical tuning range is $[f_c - (\Delta f - \delta f/2)] \pm [\Delta f + \delta f/2]$. Experimental tests have given results consistent with the theory, however it was found that critical trimming of the bandpass filters 22, 24 is necessary to avoid spurious locking positions.

The second AFC method uses the symmetry of the spectrum about the deviation, $\Delta f$. The signal from the mixer 14 which may have been low pass filtered for adjacent channel selectivity is mixed in a mixer 60 with a signal corresponding to the deviation frequency $\Delta f$ which is derived from a local oscillator 62. The output from the mixer is applied to a discriminator 66 via a low pass filter 64. The discriminator 66 compares the signal from the low pass filter 64 with a reference signal which in the present example is $\delta f$ and gives an output which is proportional to the difference between the input signal and $\delta f$. The discriminator 66 may comprise a Foster-Seeley discriminator. The output from the discriminator 66 is passed via another low pass filter 68 with a pass band between, say, 0 and 5 Hz to a control input 70 of the local oscillator 20.

Figure 6A:
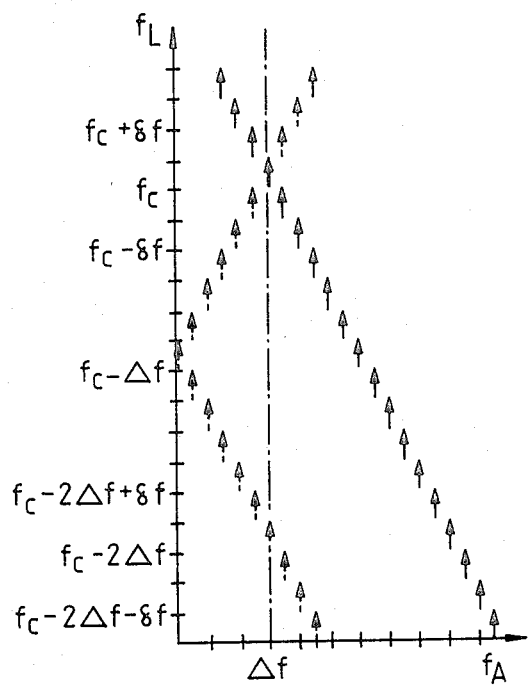
FIGS. 6A to 6C are diagrams for facilitating the understanding of the second AFC method.
Figure 6B:
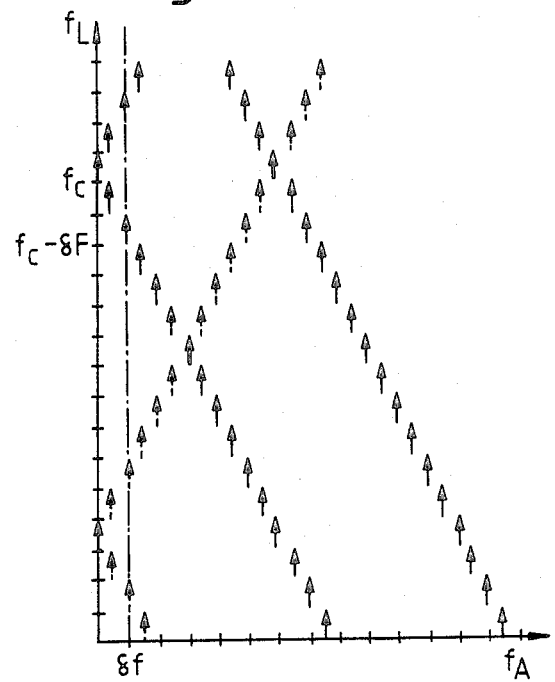
Figure 6C:
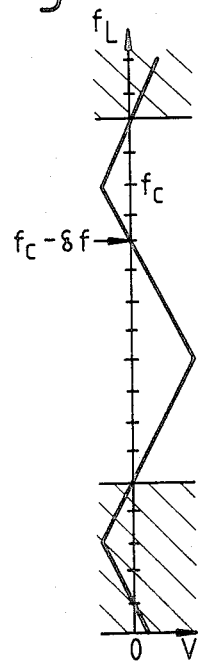

The operation of the second AFC method will more readily be understood from a consideration of FIGS. 6A to 6C. In these Figures the ordinate represents the local oscillator frequency $f_L$. In FIGS. 6A and 6B the abscissa represents the audio frequency $f_A$ and in FIG. 6C the voltage applied to the control input 70. The upstanding arrows in full lines represent signals initiated by the transmission of $f_c + \Delta f$ and those represented by broken lines are signals initiated by the transmission of $f_c - \Delta f$. It will be noted that these Figures are symmetrical about $f_L = f_c$.

FIG. 6A represents the audio spectrum of the signal from the mixer 14 and illustrates the case for the local oscillator frequency $f_L$ drifting relative to the carrier $f_c$. As mentioned above, the tones $\Delta f + \delta f$ and $\Delta f - \delta f$ move symmetrically about the "direct conversion" point (that is when $f_L = f_c$) but beyond $f_L = f_c - \Delta f$ and $f_L = f_c + \Delta f$ (not shown) then the signals track each other.

FIG. 6B illustrates the variation of the spectrum at the output of the mixer 60 as the local oscillator frequency $f_L$ drifts relative to $f_c$. The offset $\delta f$ has been marked on the abscissa.

FIG. 6C represents the transfer characteristic of the discriminator and illustrates that the correct tuning occurs when the local oscillator 20 has a frequency corresponding to $f_c - \delta f$. The shaded portions on FIG. 6C indicate regions of instability. This Figure illustrates that the second AFC system gives a non-linear control voltage variation and an asymmetric tuning range. This tuning range $[f_c - (\Delta f - \delta f)] \pm [\Delta f]$ is slightly reduced compared to the first method which also gives a non-linear control voltage variation and an asymmetric tuning range.

It is worth noting that the nominal frequency of the crystal used in the local oscillator 20 may be different from that at which it operates. On switching on the receiver the local oscillator is at the center of the initial tuning range of $[f_c - \Delta f + \delta f]$ but the final tuning range is different as indicated above.

Although not shown in FIG. 4, it has been found useful to include a diode limiter in the AFC output to overcome overshoot and spurious locking which were encountered due to the unequal positive and negative areas of the discriminator characteristic. A test of the AFC system for $\delta f / \Delta f = \frac{1}{2}$ demonstrated that a locking range of nearly $2\Delta f$ can be achieved.

An evaluation of the second AFC method demonstrated that it was possible to maintain the local oscillator 20 frequency within $\pm 250$ Hz of the carrier $f_c$ over a mis-tuning range of $\pm 2.5$ kHz.

If the local oscillator frequency $f_L$ was set to equal $f_c + \delta f$ by reversing the sign of the AFC input to the local oscillator 14 then the frequencies of interest would accordingly be different, for example the right hand deviation of the discriminator characteristic would be above the left hand one in FIG. 6C rather than below as shown so that appropriate changes would be made based on the correct tuning being at $f_L = f_c + \delta f$ and the lower region of instability beginning at $f_L = f_c - \delta f$. Also the theoretical tuning ranges in the first and second methods are $[f_c + (\Delta f - \delta f/2)] \pm [\Delta f + \delta f/2]$ and $[f_c - (\Delta f - \delta f)] \pm [\Delta f]$, respectively.

Although not shown in FIG. 4, a third AFC method comprises summing the outputs of the bandpass filters 22, 24 and applying the sum signal to the mixer 60 in place of the signal derived from the mixer 14. Thereafter the third method is the same as the second method.

Referring back to FIG. 4, automatic gain control (AGC) can be applied by, for example, connecting a summing amplifier 72 to the outputs of the amplitude detectors 26, 28. The output of summing amplifier 72 is connected to a gain control input of an adjustable gain amplifier 74 connected between the mixer 14 and the demodulating means.

Figure 1:
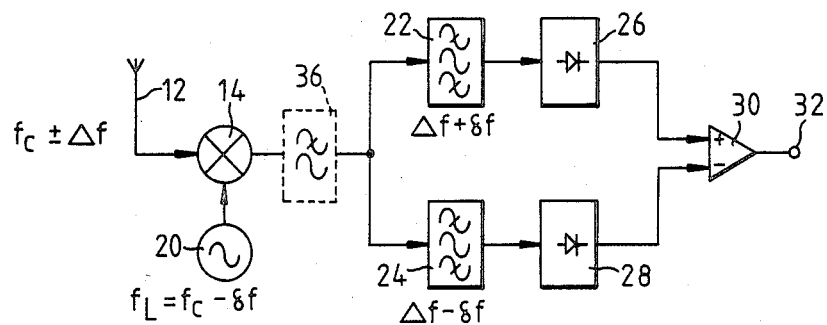
FIG. 1 is a simplified block schematic circuit diagram of a direct modulation FM data receiver made in accordance with the present invention.

In implementing the receiver circuits shown in FIGS. 1 and 4, the various blocks can be fabricated from readily available integrated circuit elements and accordingly a detailed schematic circuit diagram has not been illustrated and described. However it should be noted that the signals from the mixer 14 can be demodulated in a number of ways depending on the demodulation strategy. The demodulator in the described and illustrated embodiment is based on a demodulation strategy of comparing the energies in the two signalling tones $\Delta f + \delta f$ and $\Delta f - \delta f$. Other methods may be used to compare these energies based on this strategy. However other strategies may be used such as pulse counting or ratio detecting in order to distinguish between the signalling tones.

In the application of using the direct modulation FM data receiver for paging then a typical bit rate is 512 bits/second, the deviation $\Delta f$ is of the order of 4.5 kHz, and the carrier frequency $f_c$ is, for example, 153.175 MHz. Consequently the range of useful offsets ($\delta f$) is between substantially 250 Hz and 4.0 kHz. Thus, when the offset is 250 Hz the local oscillator frequency $f_L$ may be, for example, 153,174,750 Hz.

I claim:

1. A direct modulation FM data receiver, comprising:
    an input signal receiving element for receiving a directly-modulated FM input signal having a channel frequency within a channel frequency range of $f_c \pm \Delta f$ wherein $f_c$ is the frequency of a carrier signal and $\Delta f$ is a frequency deviation from the carrier signal;
    a signal mixer having a first input, a second input, and an output, the first input being connected to the input signal receiving element;
    local oscillator signal means for producing and applying, to the second input of the signal mixer, a local oscillator signal having a frequency within the channel frequency range of the FM input signal, but offset from the frequency of the carrier signal by an offset frequency amount $\delta f$, and
    demodulating means, connected to the output of the signal mixer, for distinguishing between signalling tones $\Delta f + \delta f$ and $\Delta f - \delta f$ of an output signal of the signal mixer and deriving, from the signalling tones $\Delta f + \delta f$ and $\Delta f - \delta f$, an output data signal.

2. A data receiver as claimed in claim 1, further comprising AFC system means for stabilizing the frequency of the local oscillator signal.

3. A direct modulation FM data receiver, comprising:
    an input signal receiving element for receiving a directly-modulated FM input signal having a channel frequency within a channel frequency range of $f_c \pm \Delta f$ wherein $f_c$ is the frequency of a carrier signal and $\Delta f$ is a frequency deviation from the carrier signal;
    a signal mixer having a first input, a second input, and an output, the first input being connected to the input signal receiving element;
    local oscillator signal means for producing and applying, to the second input of the signal mixer, a local oscillator signal having a frequency within the channel frequency range of the FM input signal, but offset from the frequency of the carrier signal by an offset frequency amount $\delta f$;
    demodulating means, coupled to the output of the mixer, for distinguishing between signalling tones $\Delta f + \delta f$ and $\Delta f - \delta f$ of an output signal of the signal mixer and deriving, from the signalling tones $\Delta f + \delta f$ and $\Delta f - \delta f$, an output data signal, and
    a low pass filter connected between the output of the signal mixer and the demodulating means.

* * * * *

UNITED STATES PATENT AND TRADEMARK OFFICE
CERTIFICATE OF CORRECTION

PATENT NO. : 4,523,324

DATED : June 11, 1985

INVENTOR(S) : CHRISTOPHER B. MARSHALL

It is certified that error appears in the above-identified patent and that said Letters Patent is hereby corrected as shown below:

IN THE TITLE PAGE: After "October 26, 1981 [NL] Netherlands....8132181"
should read:  -- Oct. 26, 1981 [GB] United Kingdom....8132181--

Signed and Sealed this

Eighth Day of October 1985

[SEAL]

Attest:

Attesting Officer

DONALD J. QUIGG

*Commissioner of Patents and Trademarks—Designate*